(12) United States Patent
Park et al.

(10) Patent No.: US 6,930,331 B2
(45) Date of Patent: Aug. 16, 2005

(54) THIN FILM TRANSISTOR FOR USE IN ACTIVE MATRIX TYPE ORGANIC LIGHT EMITTING DIODE DEVICE

(75) Inventors: Jae-Yong Park, Gyeonggi-do (KR); So-Haeng Cho, Gyeonggi-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 58 days.

(21) Appl. No.: 10/742,757

(22) Filed: Dec. 23, 2003

(65) Prior Publication Data

US 2004/0135164 A1 Jul. 15, 2004

(30) Foreign Application Priority Data

Dec. 26, 2002 (KR) .................................. 10-2002-0084610

(51) Int. Cl.[7] .............................................. H01L 29/00
(52) U.S. Cl. .............................. 257/90; 257/40; 257/94
(58) Field of Search .............................. 257/40, 89–90, 257/94, 97

(56) References Cited

U.S. PATENT DOCUMENTS 6,781,746 B2 * 8/2004 Yamazaki et al. .......... 359/321
6,833,560 B2 * 12/2004 Konuma et al. ............. 257/72
2003/0231263 A1 * 12/2003 Kato et al. ................... 349/56
2005/0012694 A1 * 1/2005 Park et al. .................... 345/76

* cited by examiner

Primary Examiner—Allan R. Wilson
(74) Attorney, Agent, or Firm—Morgan, Lewis & Bockius LLP

(57) ABSTRACT

An organic light emitting diode device includes an array layer having a plurality of thin film transistors, an organic light emitting diode formed on a second substrate, a plurality of connection patterns disposed between the first and second substrates, the connection pattern connecting a respective thin film transistor to the corresponding organic light emitting diode and a sealant between the first and second substrates, wherein each thin film transistor includes: a gate electrode on the first substrate, the gate electrode having an opening in the middle thereof; a gate insulating layer over the gate electrode; a semiconductor layer on the gate insulating layer above the gate electrode; a drain electrode on the semiconductor layer corresponding to the opening of the gate electrode; and first and second source electrodes formed respectively on both sides of the semiconductor layer and spaced apart from the drain electrode.

20 Claims, 9 Drawing Sheets

THIN FILM TRANSISTOR FOR USE IN ACTIVE MATRIX TYPE ORGANIC LIGHT EMITTING DIODE DEVICE

The present application claims the benefit of Korean Patent Application No. 2002-84610 filed in Korea on Dec. 26, 2002, which is hereby incorporated by reference.

BACKGROUND OF THE INVENTION

1. Field of the Invention

The present invention relates to an active matrix type organic light emitting diode (AMOLED) device, and more particularly, to a thin film transistor for use in a dual panel type organic light emitting diode device.

2. Discussion of the Related Art

Among flat panel displays (FPDs), organic light emitting diode (OLED) devices have been of particular interest in research and development because OLED devices are light-emitting type displays that have a wide viewing angle as well as a desirable contrast ratio, as compared with liquid crystal display (LCD) devices. Since a backlight does not need to be provided in conjunction with such OLED devices, the size and weight of OLED devices are small, as compared to other types of display devices. OELD devices have other desirable characteristics, such as low power consumption, superior brightness and fast response time. When driving OLED devices, only a low direct current (DC) voltage is required while obtaining a rapid response speed. Because OLED devices are entirely formed of materials in a solid phase arrangement, unlike LCD devices, OLED device are sufficiently strong to withstand external impacts and also have a greater operational temperature range. Moreover, fabrication of an OLED device is a relatively simple process with a few processing steps. Only deposition and encapsulation apparatuses are necessary for manufacturing the OLED devices. Accordingly, it is much cheaper to produce OLED devices compared to LCD devices or plasma display panels (PDPs)

In an active matrix organic light emitting diode (AMOLED) device, a voltage applied to the pixel and a charge for maintaining the voltage is stored in a storage capacitor from the applied voltage. This allows for a constant voltage driving the AMOLED device until a voltage for a next frame is applied, regardless of the number of the scanning lines. As a result, since an equivalent brightness is obtained with a low applied current, an AMOLED device having low power consumption while having a high resolution and large area can be made.

FIG. 1 is a circuit diagram showing a basic pixel structure of an active matrix organic light emitting diode device according to the related art. As shown in FIG. 1, a scanning line is arranged in a first direction, and a signal line and a power supply line are arranged in a second direction perpendicular to the first direction. The signal line and the power supply line are spaced apart from each other defining a pixel region therebetween. A switching thin film transistor (often referred to as a selection transistor), an addressing element, is connected to the scanning line and the signal line. A storage capacitor $C_{ST}$ is connected between the switching thin film transistor (TFT) and the power supply line. A driving thin film transistor (often referred to as a drive transistor), a current source element, is connected to the power supply line and an organic electroluminescent (EL) diode. The storage capacitor $C_{ST}$ is connected across the driving thin film transistor (TFT). The organic EL diode has an organic EL layer (not shown) between an anode and a cathode. The switching TFT adjusts a voltage applied to the driving TFT and the storage capacitor $C_{ST}$ stores a charge to maintain the voltage applied to the driving TFT.

When a scan signal of the scanning line is applied to a switching gate electrode of the switching TFT, the switching TFT is turned ON, and an image signal of the signal line is applied to a driving gate electrode of the driving TFT and the storage capacitor $C_{ST}$ through the switching element. As a result, the driving TFT is turned ON. When the driving TFT is turned ON, a current of the power supply line is applied to the organic light emitting diode through the driving TFT. As a result, light is emitted. The current density of the driving element is modulated by the image signal applied to the driving gate electrode. As a result, the organic light emitting diode can display images having multiple levels of gray scale. Moreover, since the voltage of the image signal stored in the storage capacitor $C_{ST}$ is applied to the driving gate electrode, the current density flowing into the organic light emitting diode can be maintained at a uniform level until the next image signal is applied even when the switching element is turned OFF.

FIG. 2 is a schematic plan view of an active matrix organic light emitting diode device according to the related art. As shown in FIG. 2, the active matrix organic light emitting diode device includes, for example, inverted stagger type thin film transistors. A gate line 12 crosses a data line 36 and a power supply line 34, which are spaced apart from each other. A pixel region is defined between the gate line 12 and the spaced apart data line 36 and power supply line 34. A switching thin film transistor (TFT) $T_S$ is disposed adjacent to where the gate line 12 and the data line 36 cross each other. The switching TFT $T_S$ includes a switching gate electrode 14 extending from the gate line 12, a switching source electrode 26 extending from the data line 36, a switching drain electrode 30 spaced apart from the switching source electrode 26, and a switching semiconductor layer 22 having an island shape above the switching gate electrode 14.

A driving TFT $T_D$ is connected to the switching TFT $T_S$ and the power supply line 34. The driving TFT $T_D$ includes a driving gate electrode 16, a driving source electrode 28, a driving drain electrode 32 and a driving semiconductor layer 24. The driving gate electrode 16 is connected with the switching drain electrode 30 and formed of the same material as the gate line 12 in the same fabrication step. The driving source and drain electrodes 28 and 32 overlap side portions of the driving gate electrode 16, and are formed of the same material as the data line 36. The driving semiconductor layer 24 having an island shape is disposed above the driving gate electrode 16 between the driving source and drain electrodes 28 and 32.

As also shown in FIG. 2, a power electrode 44 extends from the power supply line 34 and is connected with the driving source electrode 28. A first electrode 54 of the organic light emitting diode is disposed in the pixel region and connected to the driving drain electrode 32. A portion of the power supply line 34 is used as a first capacitor electrode for the storage capacitor $C_{ST}$. Further, the storage capacitor $C_{ST}$ also includes a second capacitor electrode 42 that extends from the switching drain electrode 30. More particularly, the area where the second capacitor electrode 43 overlaps the power supply line 34 constitutes the storage capacitor $C_{ST}$.

FIG. 3 is a schematic cross-sectional view taken along line I—I of FIG. 2. Hereinafter with reference to FIG. 3, the driving gate electrode will be referred to as a gate electrode, the driving source electrode as a source electrode, the driving drain electrode as a drain electrode, and the driving semiconductor layer as a semiconductor layer. As shown in FIG. 3, a driving thin film transistor (TFT) $T_D$ includes a gate electrode 16, a semiconductor layer 24, and source and drain electrodes 28 and 32 over a substrate 10. The gate electrode 16 is disposed on a substrate 10. A gate insulating layer 20 is formed on the substrate covering the gate electrode 16. An active layer 24a and an ohmic contact layer 24b are formed on the gate insulating layer 20 and over the gate electrode 16. The active layer 24a and the ohmic contact layer 24b constitute the semiconductor layer 24. Spaced apart source and drain electrodes 28 and 32 are formed over the semiconductor layer 24 and respectively contact the source and drain through ohmic contact layer 24b. A portion of the ohmic contact layer 24b between the source and drain electrodes 28 and 32 is removed to form a channel region by exposing a portion of the active layer 24a.

As also shown in FIG. 3, an interlayer insulator 48 is formed to cover the driving TFT $T_D$. The interlayer insulator 48 has a source contact hole 46 therein which expose a portion of the source electrode 28. A power electrode 44 that extends from the power supply line 34 is formed on the interlayer insulator 48, and contacts the source electrode 28. A passivation layer 52 is formed on the interlayer insulator 48 that covers the power electrode 44. A portion of the interlayer insulator 48 and a portion of the passivation layer 52 are etched to have a drain contact hole 50 that exposes a portion of the drain electrode 32. A first electrode 54 of the organic EL diode is formed on the passivation layer 52 to connect to the drain electrode 32. As described above in reference to FIG. 2, the first electrode 54 is disposed in a pixel region.

In the active matrix type organic light emitting diode device of the related art, as is widely known, the driving TFT $T_D$ is continuously under a direct current (DC) stress. Therefore, the electrical characteristics of the driving TFT deteriorate because charge trapping or/and other defects occur in the driving TFT. Accordingly, the life span of the driving TFT decreases. Since the gate insulating layer 20 is formed by the Plasma Enhanced Chemical Vapor Deposition (PECVD) method, the gate insulating layer 20 does not properly cover steps of the gate electrode 16. Accordingly, a plurality of voids are generated in portions II of the gate insulating layer 20 where the gate insulating layer 20 covers the steps of the gate electrode 16, as shown in FIG. 3. Thus, when the direct current (DC) is applied to the driving TFT for a relatively long time, the step portions II may further deteriorate or be further damaged.

FIG. 4 is a schematic cross-sectional view illustrating an organic light emitting diode device according to the related art. Although FIG. 4 only shows two pixels in which each has three sub-pixels, this schematic is only a conceptual illustration and there will be a lot of pixels in the organic light emitting diode device. As shown in FIG. 4, first and second spaced apart substrates 70 and 90, which have inner surfaces facing each other, have a plurality of sub-pixel regions. An array layer 80 including a driving thin film transistor (TFT) $T_D$ in each sub-pixel region is formed on an inner surface of the first substrate 70. A first electrode 72 connected to the driving TFT $T_D$ is formed on the array layer 80 in each pixel region. Red, green and blue organic electroluminescent (EL) layers 74 are alternately formed on the first electrode 72. A second electrode 76 is formed on the organic EL layers 74. The first and second electrodes 72 and 76, and the organic EL layer 74 interposed therebetween constitute an organic EL diode E. The organic EL device shown in FIG. 4 is a bottom type where light is emitted from the organic EL layer 74 through the first electrode 72 and out of the first substrate 70.

The second substrate 90 is used as an encapsulation substrate. The second substrate 90 has a concave portion 92 at its inner center. The concave portion 92 is filled with a moisture absorbent desiccant 94 that removes moisture and oxygen to protect the organic EL diode E. The inner surface of the second substrate 90 is spaced apart from the second electrode 76. The first and second substrates 70 and 90 are attached with a sealant 85 at a peripheral portion of the first and second substrates 70 and 90 for encapsulation.

In an organic light emitting diode (OLED) device according to the related art, a TFT array part and an organic electroluminescent (EL) diode are formed over a first substrate, and an additional second substrate is attached to the first substrate for encapsulation. However, when the TFT array part and the organic EL diode are formed on one substrate in this way, production yield of the organic ELD is determined by a multiplication of the TFT's yield together with the organic EL diode's yield. Since the organic EL diode's yield is relatively low, the production yield of the overall OLED device becomes limited by the organic EL diode's yield. For example, even when a TFT is well fabricated, the OLED device using a thin film of about 1000 angstroms (Å) thickness can be judged as bad due to the defects of an organic electroluminescent layer. This results in loss of materials and increased production costs.

In general, the OLED devices are classified into bottom emission types and top emission types according to an emission direction of light used for displaying images via the organic ELDs. Bottom emission type OLED devices have the advantages of high encapsulation stability and high process flexibility. However, the bottom emission type OLED devices are ineffective for high resolution devices because they have poor aperture ratios. In contrast to bottom emission type OLED devices, top emission OLED devices have a higher expected life span because they have simpler circuit layouts that still yield a high aperture ratio. However, in top emission type OLED devices, the cathode is generally formed on an organic electroluminescent layer. As a result, transmittance and optical efficiency of a top emission type OLED device are reduced because of a limited number of materials that may be selected as the cathode. If a thin film-type passivation layer is formed on the cathode to prevent a reduction of the light transmittance, the thin film-type passivation layer can still fail in preventing the infiltration of exterior air into the organic electroluminescent layer.

SUMMARY OF THE INVENTION

Accordingly, the present invention is directed to an organic light emitting diode device that substantially obviates one or more of the problems due to limitations and disadvantages of the related art.

An object of the present invention is to provide an organic light emitting diode device having an improved production yield.

Another object of the present invention is to provide an organic light emitting diode device having a high resolution and a high aperture ratio.

Another object of the present invention is to provide a dual panel type organic light emitting diode device in which a TFT array and an organic light emitting diode are disposed in first and second substrates, respectively.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic light emitting diode device includes first and second spaced apart substrates facing each other, an array layer formed on the first substrate, the array layer having a plurality of thin film transistors, an organic light emitting diode formed on the second substrate, a plurality of connection patterns disposed between the first and second substrates, the connection pattern connecting a respective thin film transistor to the corresponding organic electroluminescent diode and a sealant between the first and second substrates to encapsulate the first and second substrates in peripheral portion thereof, wherein each thin film transistor includes: a gate electrode on the first substrate, the gate electrode having an opening in the middle thereof; a gate insulating layer over the gate electrode; a semiconductor layer on the gate insulating layer above the gate electrode; a drain electrode on the semiconductor layer corresponding to the opening of the gate electrode; and first and second source electrodes formed respectively on both sides of the semiconductor layer and spaced apart from the drain electrode.

In another aspect, a method of making an organic light emitting diode device includes forming a gate electrode on the first substrate with an opening in the middle thereof, forming a gate insulating layer over the gate electrode, forming a semiconductor layer on the gate insulating layer above the gate electrode, forming a drain electrode on the semiconductor layer corresponding to the opening of the gate electrode, forming first and second source electrodes respectively on both sides of the semiconductor layer and spaced apart from the drain electrode, forming an organic light emitting diode on a second substrate, forming a connection pattern between the drain electrode and the light emitting diode and forming a sealant between the first and second substrates to encapsulate the first and second substrates in peripheral portion thereof.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 1:
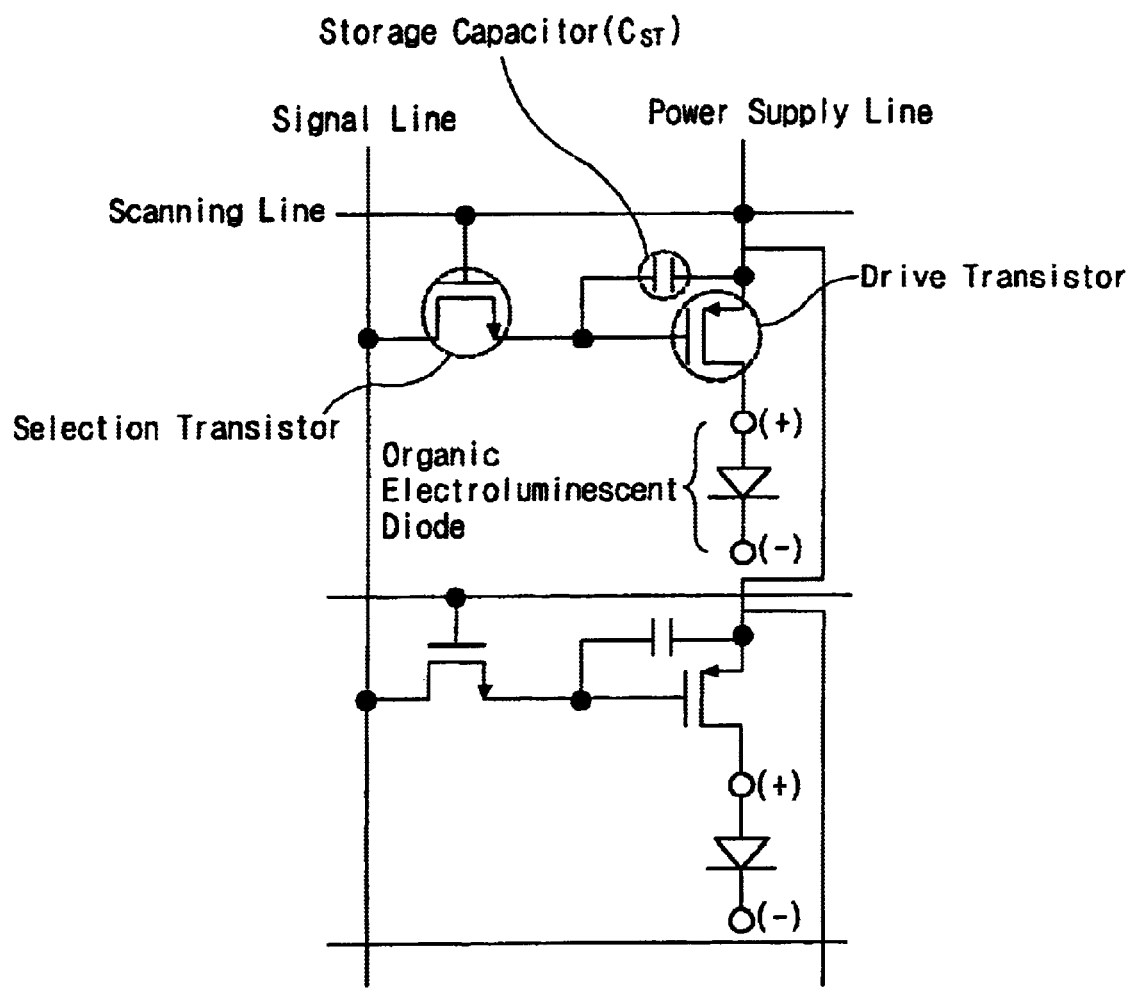
FIG. 1 is a circuit diagram showing a basic pixel structure of an active matrix organic light emitting diode device according to a related art.
Figure 2:
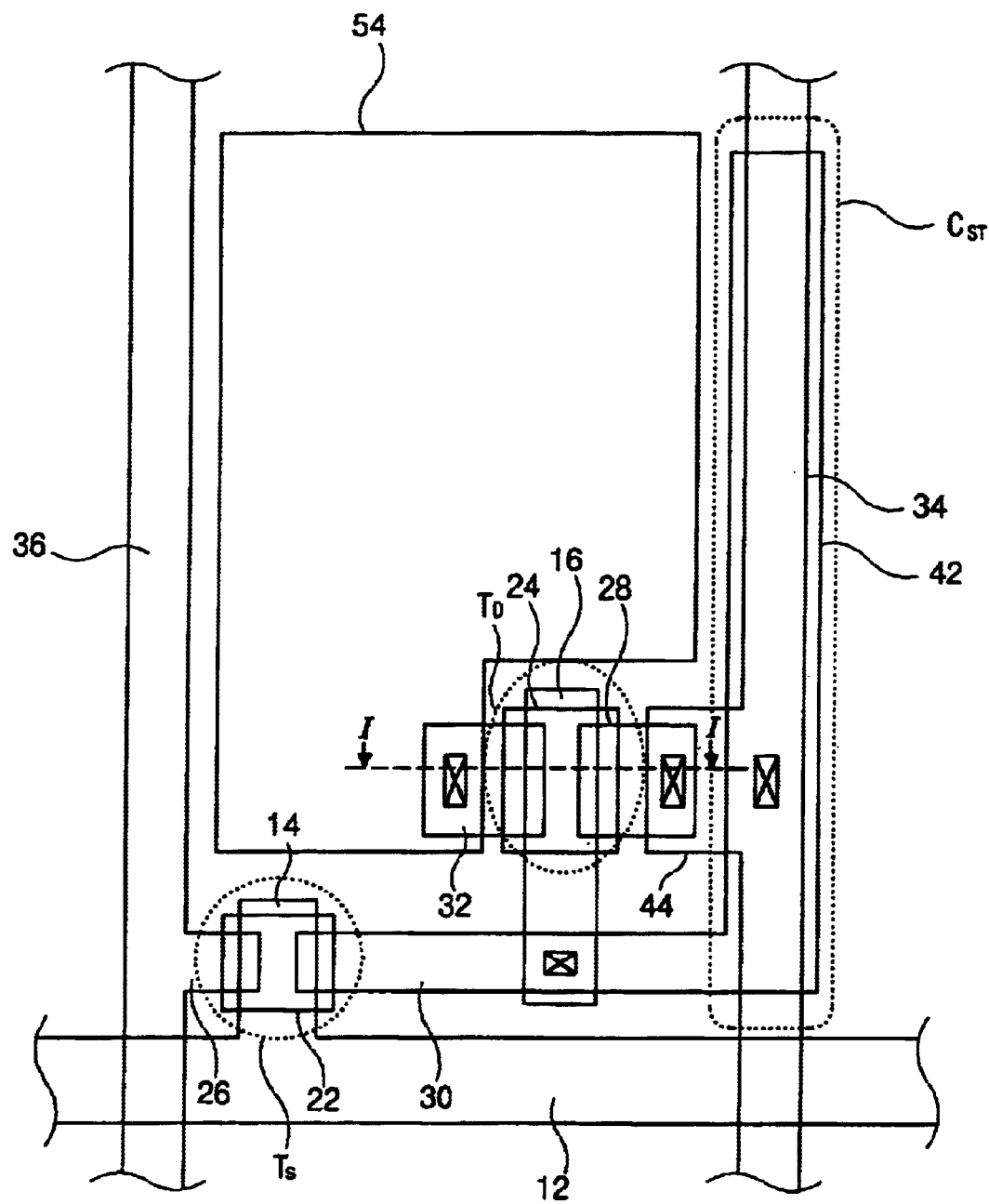
FIG. 2 is a schematic plan view of an active matrix organic light emitting diode device according to the related art.
Figure 3:
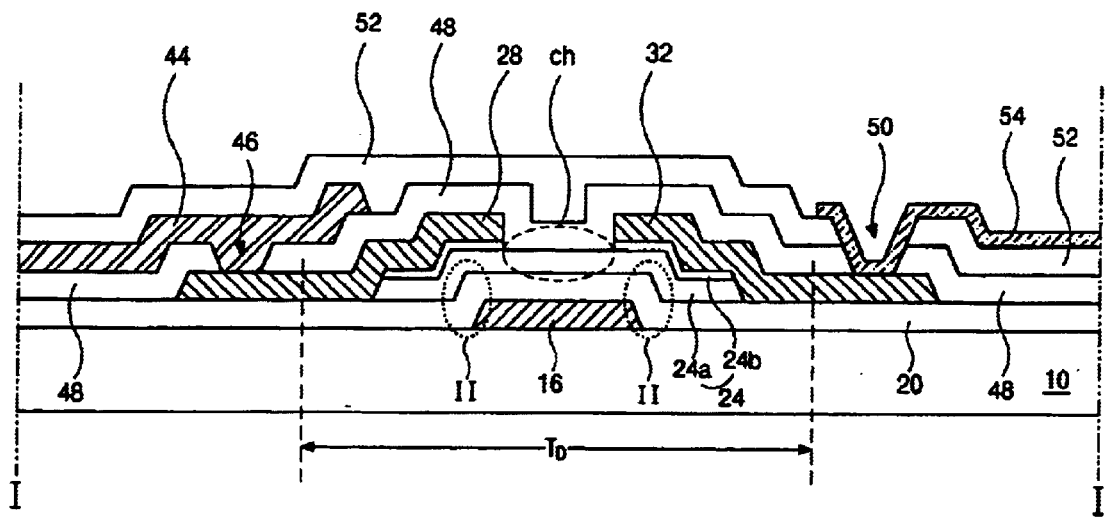
FIG. 3 is a schematic cross-sectional view taken along the line I—I of FIG. 2.
Figure 4:
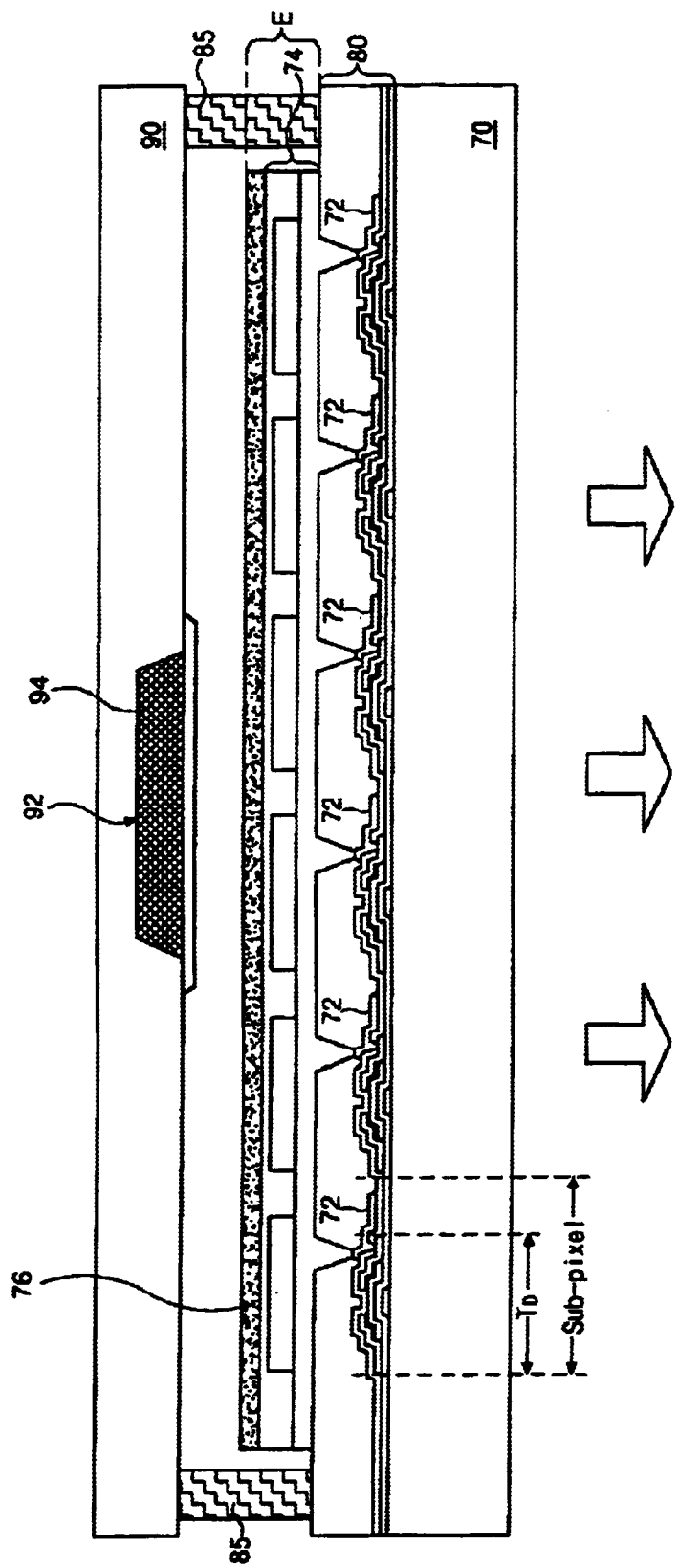
FIG. 4 is a schematic cross-sectional view illustrating an organic light emitting diode device according to the related art.
Figure 5:
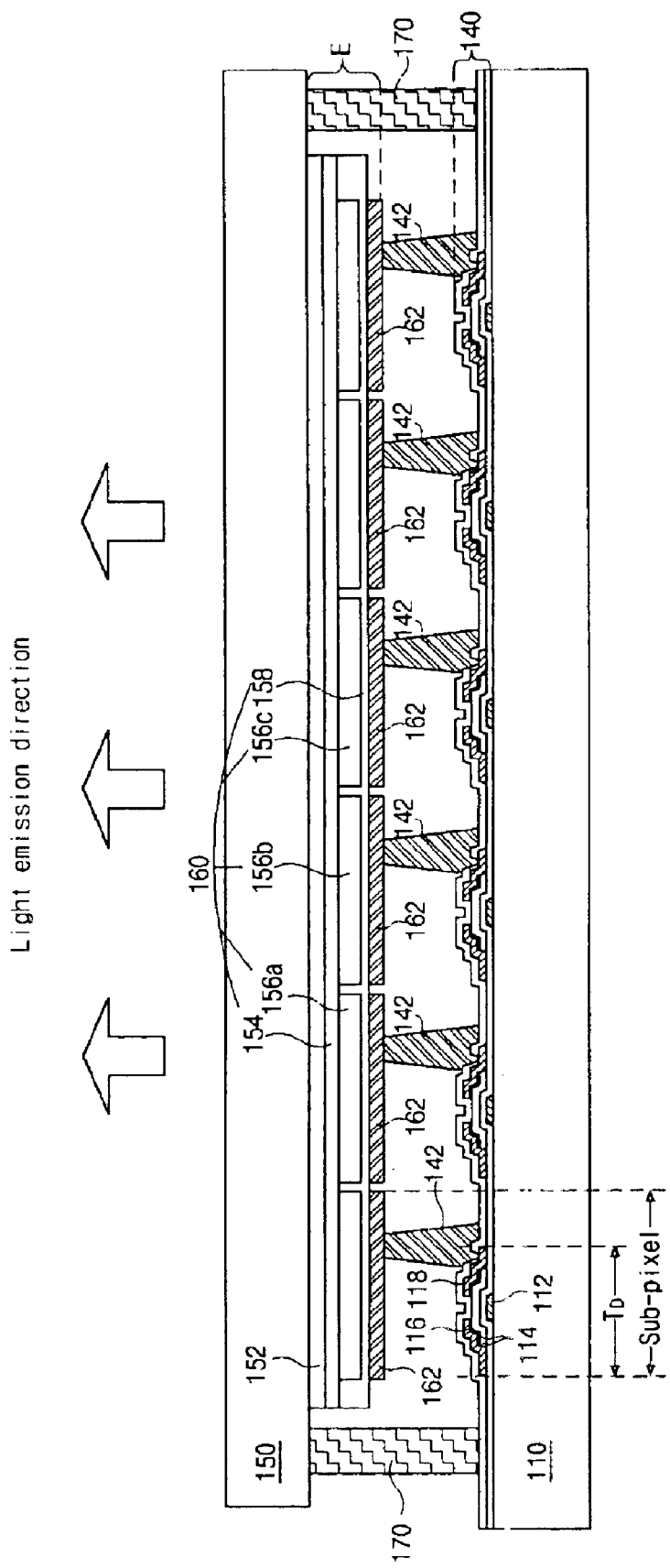
FIG. 5 is a schematic cross-sectional view of an organic light emitting diode (OLED) device according to an embodiment of the present invention.

FIG. 5 is a schematic cross-sectional view of an organic light emitting diode (OLED) device according to an embodiment of the present invention. As shown in FIG. 5, first and second spaced apart substrates 110 and 150, which have inner surfaces facing each other, have a plurality of sub-pixel regions. An array layer 140 including a driving thin film transistor (TFT) $T_D$ in each sub-pixel region is formed on an inner surface of the first substrate 110. A connection pattern 142 connected to the driving TFT $T_D$ is formed on the array layer 140 in each sub-pixel region. The connection pattern 142 can be made of a conductive material or multiple layers, including an insulating material with one or more layers of conductive material, having sufficient thickness for connection. An additional connection electrode can be used for connecting the connection pattern 142 and the driving TFT $T_D$. The driving TFT $T_D$ includes a gate electrode 112, an active layer 114, and source and drain electrodes 116 and 118. The connection pattern 142 is connected to the drain electrode 118.

A first electrode 152 is formed on an inner surface of the second substrate 150. An organic electroluminescent (EL) layer 160 including red, green and blue organic emission layers 156a, 156b and 156c alternately disposed in each sub-pixel region is formed on the first electrode 152. A second electrode 162 is formed on the organic EL layer 160 in each sub-pixel region P. The organic EL layer 160 can be formed of a single layer or of multiple layers. In the case of multiple layers, the organic EL layer 160 may include a first carrier-transporting layer 154 on the first electrode 152, one of red, green and blue emission layers 156a, 156b and 156c on the first carrier-transporting layer 154 and a second carrier-transporting layer 158 on each of the emission layers 156a, 156b and 156c. For example, when the first and second electrodes 152 and 162 are respectively an anode and a cathode, the first carrier-transporting layer 154 corresponds to a hole-injecting layer and a hole-transporting layer, and the second carrier-transporting layer 158 corresponds to an electron-transporting layer and an electron-injecting layer. The first and second electrodes 152 and 162, and the organic EL layer 160 interposed therebetween constitute an organic EL diode E.

The first and second substrates 110 and 150 are attached with a sealant 170 at a peripheral portion thereof. A top surface of the connection pattern 142 contacts bottom surface of the second electrode 162, thereby a current of the driving TFT $T_D$ flowing into the second electrode 162 through the connection pattern 142. An organic light emitting diode (OLED) device according to exemplary embodiments of the present invention is a dual panel type where an array layer 140 and an organic EL diode E are formed on respective substrates and a connection pattern 142 electrically connects the array layer 140 to the organic EL diode E, which is an organic light emitting diode. Various modifications and variations can be made in the structure of the TFT and the connecting method of the array layer and the organic EL diode. Moreover, since the OLED device according to exemplary embodiments of the present invention is a top emission type, a thin film transistor can be easily designed while obtaining a high resolution and high aperture ratio.

Figure 6A:
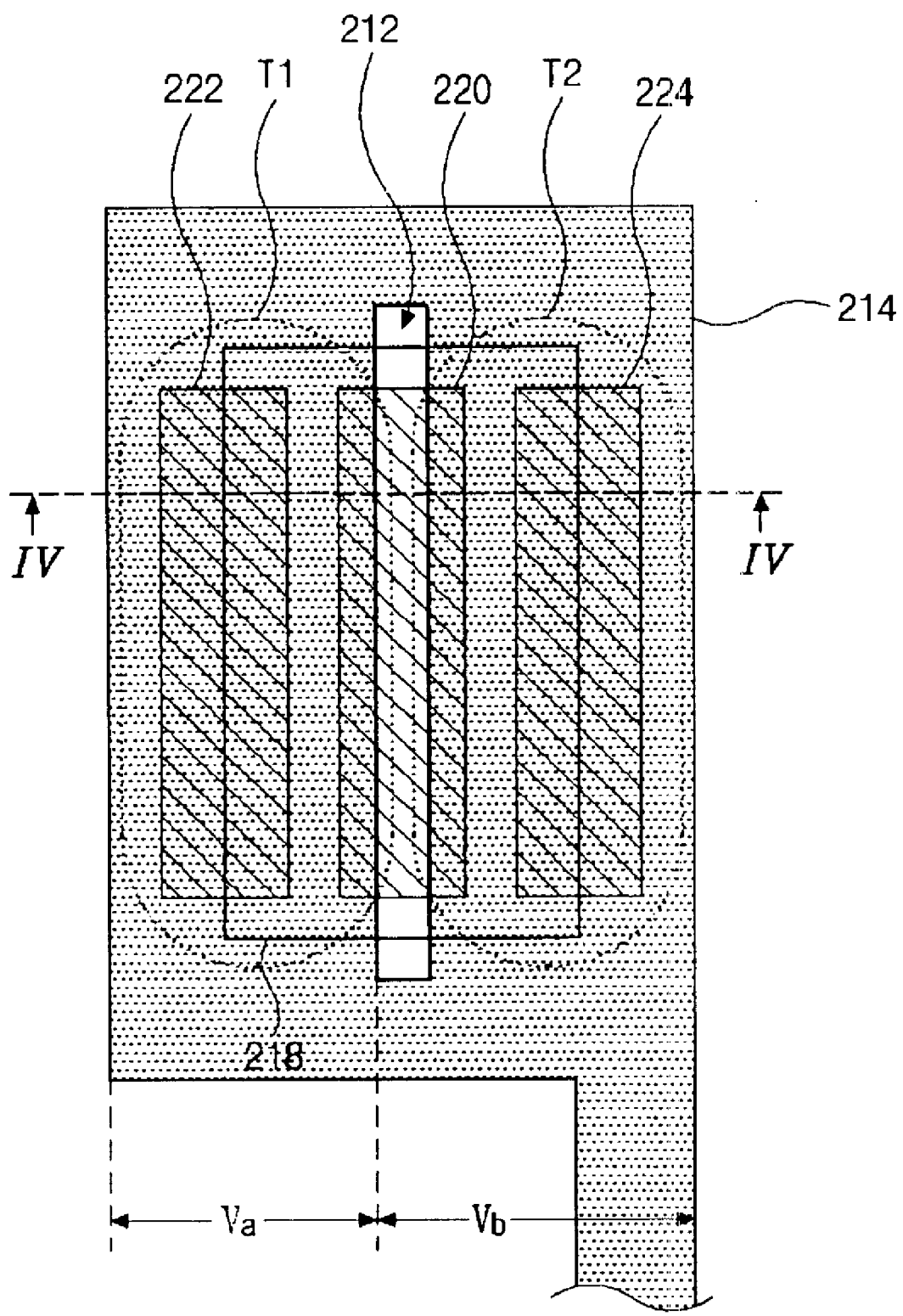
FIG. 6A is a plan view illustrating a thin film transistor for use in the organic light emitting diode device according to a first embodiment of the present invention.
Figure 6B:
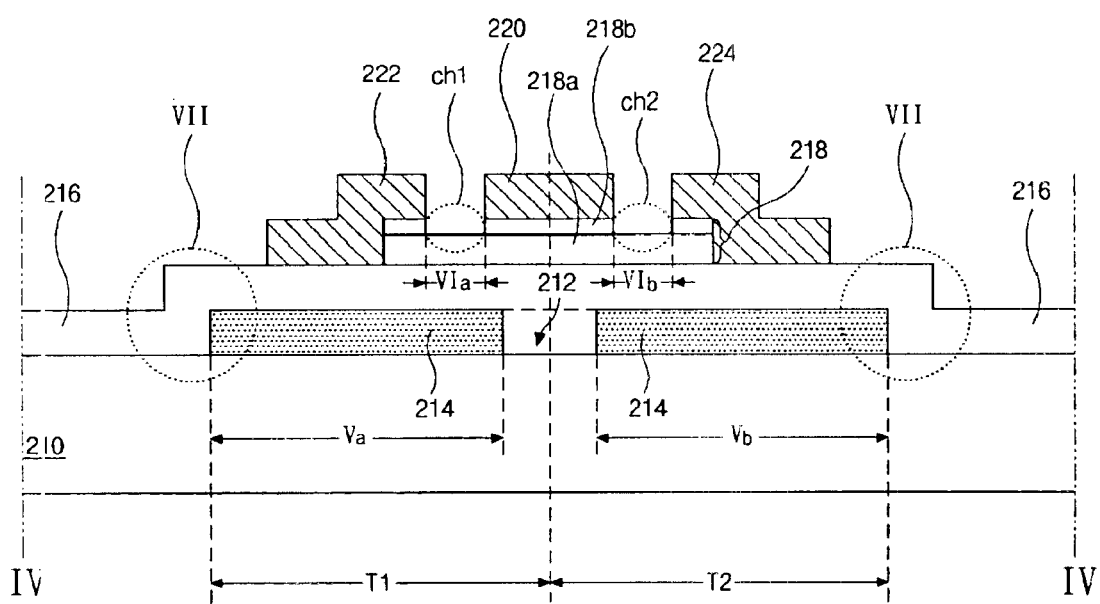
FIG. 6B is a cross-sectional view taken along the line IV—IV of FIG. 6A.

FIG. 6A is a plan view illustrating a thin film transistor for use in the organic light emitting diode device according to a first embodiment of the present invention, and FIG. 6B is a cross-sectional view taken along the line IV—IV of FIG. 6A. In FIGS. 6A and 6B, a gate electrode 214 that has an opening 212 in the middle thereof is formed on a substrate 210. A semiconductor layer 218 is formed above a center portion of the gate electrode 214. A drain electrode 220 is formed on the semiconductor layer 218 corresponding in position to the opening 212. First and second source electrodes 222 and 224 are formed on both sides of the drain electrode 220 and respectively contact side portions of the semiconductor layer 218. The first and second source electrodes 222 and 224 are disposed directly over the gate electrode 214. A left portion Va of the gate electrode 214, the semiconductor layer 218, the first source electrode 222 and the drain electrode 220 constitute a first thin film transistor T1. A right portion Vb of the gate electrode 214, the semiconductor layer 218, the second source electrode 224 and the drain electrode 220 constitute a second thin film transistor T2.

The layer structure of the first and second thin film transistors T1 and T2 will be explained in reference to FIG. 6B. The gate electrode 214 having the opening 212 in the middle is formed on the substrate 210. The left and right portions Va and Vb of the gate electrode 214 can be referred to as a first gate electrode and a second gate electrode, respectively. A gate insulating layer 216 is formed on the substrate 210 to completely cover the gate electrode 214. The semiconductor layer 218 is formed on the gate insulating layer 216 and right above the opening 212. The semiconductor layer 218 overlaps portions of the first and second gate electrodes Va and Vb on both sides of the opening 212. The drain electrode 220 is formed on the semiconductor layer 218, and corresponds in position to the opening 212 of the gate electrode 214. On both left and right sides of the drain electrode 220, the first and second source electrodes 222 and 224 are formed in contact with side portions of the semiconductor layer 218. The first and second source electrodes 222 and 224 are spaced apart from the drain electrode 220 and located above the gate electrode 214.

As also shown in FIG. 6B, the semiconductor layer 218 includes an active layer 218a and an ohmic contact layer 218b, which are stacked up in series. A space between the first source electrode 222 and the drain electrode 220 is defined as a first channel portion VIa, and a space between the second source electrode 224 and the drain electrode 220 is defined as a second channel portion VIb. In the first and second channel portions VIa and V2b, the ohmic contact layer 218b is removed and thus the underlying active layer 218a is exposed. Thus, the exposed portions of the active layer 218a become first and second channel ch1 and ch2, respectively, in the first and second thin film transistors T1 and T2.

Accordingly, the first thin film transistor T1 includes the first gate electrode Va, a left portion of the semiconductor layer 218, the first channel ch1, the first source electrode 222 and the drain electrode 220. The second thin film transistor T2 includes the second gate electrode Vb, a right portion of the semiconductor layer 218, the second channel ch2, the second source electrode 224 and the drain electrode 220. In the first embodiment of present invention shown in FIGS. 6A and 6B, since the first and second source electrodes 222 and 224 are formed directly above the area of the gate electrode 214, the thin film transistor can maintain electrical characteristics although the gate insulating layer 216 is deteriorated and/or damaged at step portions VII in the gate insulating layer 216.

Figure 7:
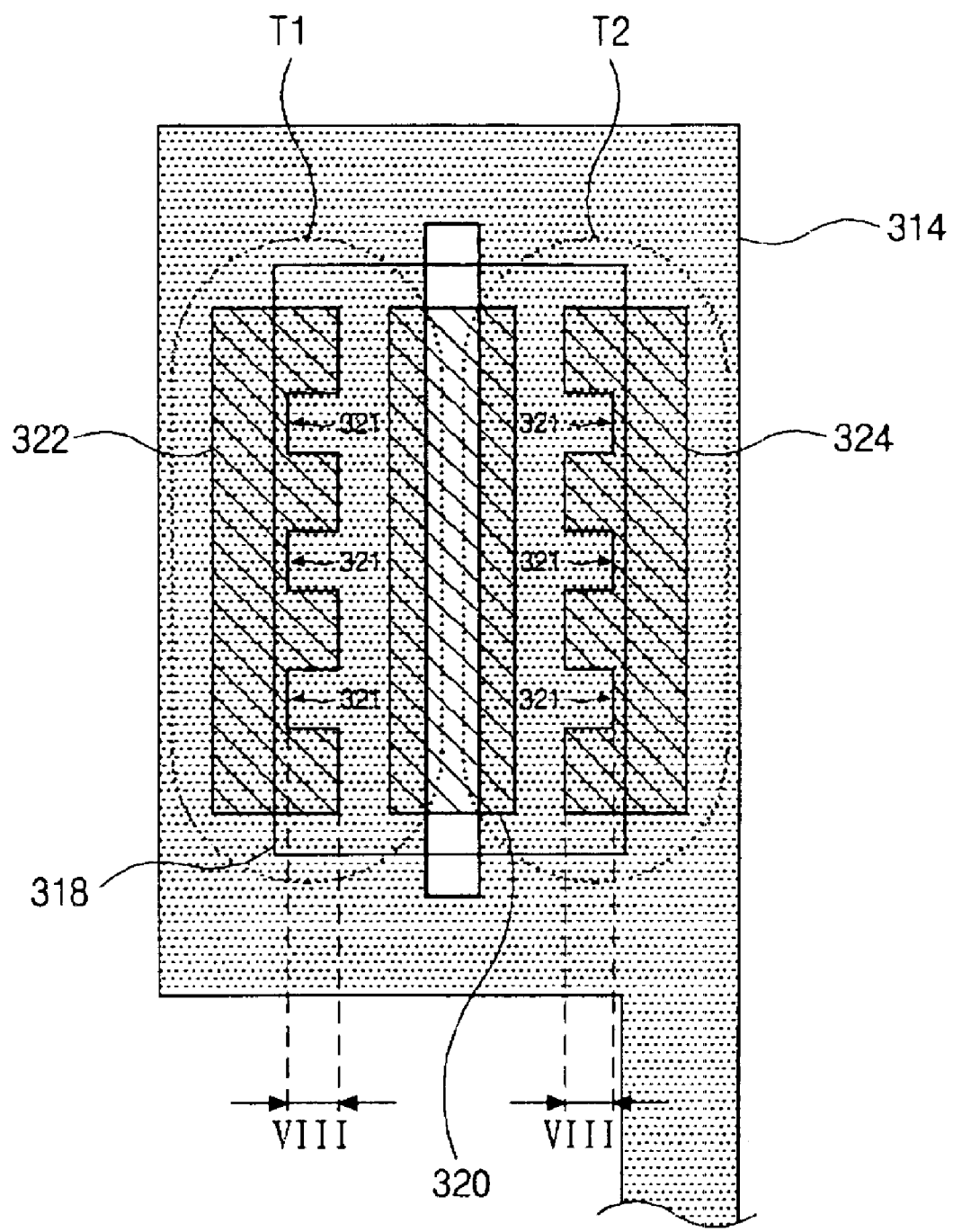
FIG. 7 is a plan view illustrating a thin film transistor for use in the organic light emitting diode device according to a second embodiment of the present invention.

FIG. 7 is a plan view illustrating a thin film transistor for use in the organic light emitting diode device according to a second embodiment of the present invention. The thin film transistor structure shown in FIG. 7 has similarities to that of the thin film transistor structure shown FIG. 6B, so some of the detailed explanations for some of the parts are omitted. As shown in FIG. 7, first and second source electrodes 322 and 324 have a plurality of indentations 321 in the sides of the first and second source electrodes 322 and 324 that face a drain electrode 320. The indentations 321 create a plurality of prominences VIII in the first and second source electrodes 322 and 324. More particularly, the plurality of prominences VIII of the first and second source electrodes 322 and 324 face the drain electrode 320 and overlap a semiconductor layer 318. In this embodiment, the first and second electrode 322 and 324 are also disposed directly above the area of the gate electrode 314. Due to the prominences VIII and the indentations 312, the channels of the first and second thin film transistors T1 and T2 have a variety of widths, and thus the thin film transistors T1 and T2 have improved electrical characteristics. Moreover, the deterioration and/or damage in the step portion of the gate insulating layer will not affect the electrical characteristics of the first and second thin film transistors T1 and T2.

Figure 8:
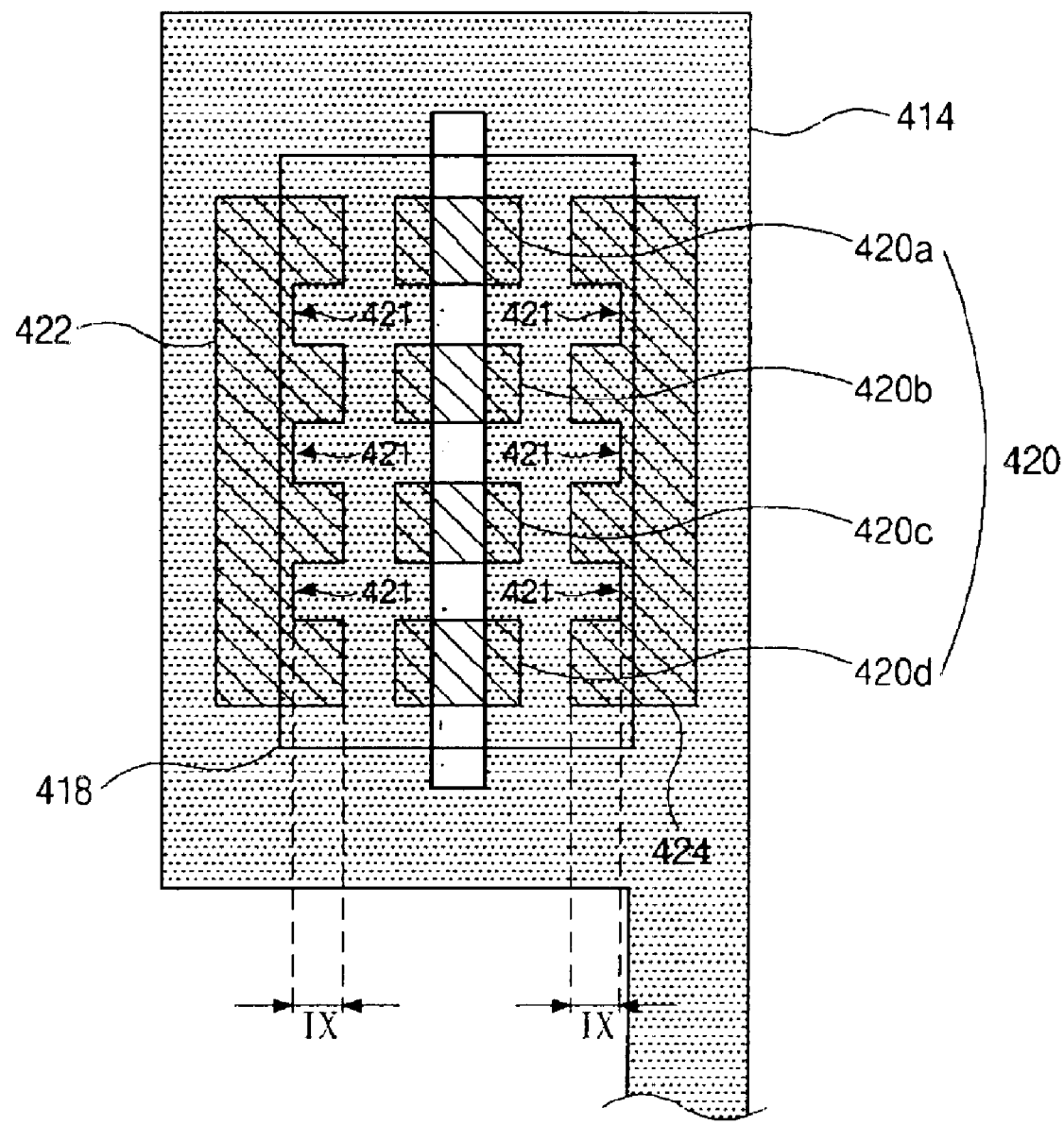
FIG. 8 is a plan view illustrating a thin film transistor for use in the organic light emitting diode device according to a third embodiment of the present invention.

FIG. 8 is a plan view illustrating a thin film transistor for use in the organic light emitting diode device according to a third embodiment of the present invention. The thin film transistor structure of FIG. 8 has similarities to that of the thin film transistor structure shown FIG. 7, so some of the detailed explanations for some of the parts in FIG. 8 have been omitted since these parts are the same as parts in FIG. 7. In FIG. 8, first and second source electrode 422 and 424 have a plurality of indentations 421 in the sides of first and second source electrode 422 and 424 that face a drain electrode 420. Thus, a plurality of prominences IX of the first and second source electrodes 422 and 424 face the drain electrode 420 and overlap a semiconductor layer 418. In this embodiment, the drain electrode 420 is divided into drain electrode patterns 420a, 420b, 420c and 420d in which each pattern has an island shape that corresponds to the prominence IX of the first and second source electrodes 422 and 424. Although not shown in FIG. 8, the drain electrode patterns 420a, 420b, 420c and 420d are connected to each other by an additional electrode pattern and thus receive the same signal. Furthermore, as shown in FIG. 8, the first and second electrode 422 and 424 are also disposed directly above the area of the gate electrode 414.

The thin film transistor structures illustrated hereinbefore in FIGS. 6 to 8 can be adopted in a driving thin film transistor for use in an organic light emitting diode device. Accordingly, an organic light emitting diode device in accordance with embodiments of the present invention has various advantages. First, since array patterns and an organic light emitting diode device, such as an EL diode, are formed on the respective substrate, production yield and production management efficiency are improved, and lifetime of an organic light emitting diode device is lengthened. Second, since the OLED is a top emission type, a driving thin film transistor can be easily designed such that high resolution and high aperture ratio can be obtained regardless of lower array patterns. Third, since the drain electrode and the source electrode are formed directly above the area of the gate electrode, damage and deterioration around the step of the gate electrode insulation layer does not affect the electrical characteristics of a driving thin film transistor so that direct current (DC) stress is prevented. Accordingly, the stability and reliability of the driving thin film transistor is improved while the high resolution and improved picture quality can be maintained.

It will be apparent to those skilled in the art that various modifications and variations can be made in the organic light emitting diode device of the present invention without departing from the spirit or scope of the invention. Thus, it is intended that the present invention cover the modifications and variations of this invention provided they come within the scope of the appended claims and their equivalents.

What is claimed is:

1. An organic light emitting diode device, comprising:
   first and second spaced apart substrates facing each other;
   an array layer formed on the first substrate, the array layer having a plurality of thin film transistors;
   an organic light emitting diode formed on the second substrate;
   a plurality of connection patterns disposed between the first and second substrates, the connection pattern connecting respective thin film transistor to the corresponding organic light emitting diode; and
   a sealant between the first and second substrates to encapsulate the first and second substrates in peripheral portion thereof,
   wherein each thin film transistor includes:
      a gate electrode on the first substrate, the gate electrode having an opening in the middle thereof;
      a gate insulating layer over the gate electrode;
      a semiconductor layer on the gate insulating layer above the gate electrode;
      a drain electrode on the semiconductor layer corresponding to the opening of the gate electrode; and
      first and second source electrodes formed respectively on both sides of the semiconductor layer and spaced apart from the drain electrode.

2. The device according to claim 1, wherein the first and second source electrodes are disposed directly above an area of the gate electrode.

3. The device according to claim 1, wherein the connection pattern contacts the drain electrode.

4. The device according to claim 1, wherein the gate electrode has a first gate portion on one side of the opening and a second gate portion on another side of the opening.

5. The device according to claim 4, wherein each of the thin film transistors has a first transistor and a second transistor.

6. The device according to claim 5, wherein the first gate portion, the semiconductor layer, the first source electrode and the drain electrode constitute the first transistor.

7. The device according to claim 5, wherein the second gate portion, the semiconductor layer, the second source electrode and the drain electrode constitute the second transistor.

8. The device according to claim 1, wherein the semiconductor layer includes an active layer and an ohmic contact layer above the gate insulating layer.

9. The device according to claim 8, wherein the first and second source electrodes and the drain electrode contact through the ohmic contact layer.

10. The device according to claim 8, wherein portions of the ohmic contact layer between the drain electrode and the first source electrode and between the drain electrode and the second source electrode are etched to expose portions of the active layer.

11. The device according to claim 10, wherein an exposed portion of the active layer between the drain electrode and the first source electrode becomes a first channel of the first transistor, and exposed portion of the active layer between the drain electrode and the second source electrode becomes a second channel of the second transistor.

12. The device according to claim 1, wherein the first and second source electrodes have a plurality of indentations in the sides of the first and second source electrodes that face the drain electrode.

13. The device according to claim 1, wherein the first and second source electrodes have a plurality of prominences in the sides of the first and second source electrodes that face the drain electrode.

14. The device according to claim 13, wherein the plurality of prominences of the first and second source electrodes overlap the semiconductor layer.

15. The device according to claim 14, wherein the drain electrode has a plurality of drain electrode patterns in which each pattern has an island shape that corresponds to each prominence of the first and second source electrodes.

16. The device according to claim 1, wherein the organic light emitting diode device is a dual panel type where the first and second substrates are encapsulated.

17. A method of making an organic light emitting diode device, comprising:
   forming a gate electrode on the first substrate with an opening in the middle thereof;
   forming a gate insulating layer over the gate electrode;
   forming a semiconductor layer on the gate insulating layer above the gate electrode;
   forming a drain electrode on the semiconductor layer corresponding to the opening of the gate electrode;
   forming first and second source electrodes respectively on both sides of the semiconductor layer and spaced apart from the drain electrode;
   forming an organic light emitting diode on a second substrate;
   forming a connection pattern between the drain electrode and the organic light emitting diode; and
   forming a sealant between the first and second substrates to encapsulate the first and second substrates in peripheral portion thereof.

18. The method of claim 17, wherein forming first and second source electrodes include forming a plurality of indentations in the sides of the first and second source electrodes that face the drain electrode.

19. The method of claim 17, wherein forming first and second source electrodes include forming a plurality of prominences in the sides of the first and second source electrodes that face the drain electrode.

20. The method of claim 19, forming a drain electrode includes forming a plurality of drain electrode patterns in which each pattern has an island shape that corresponds to each prominence of the first and second source electrodes.

* * * * *